US012804794B2

(12) United States Patent
Hill et al.

(10) Patent No.: US 12,804,794 B2
(45) Date of Patent: *Nov. 17, 2026

(54) INDUCTION FEED THROUGH SYSTEM

(71) Applicant: Rimere, LLC, Lafayette, CO (US)

(72) Inventors: Garrett Hill, Boulder, CO (US); Andrew Murray, Lafayette, CO (US)

(73) Assignee: Rimere, LLC, Lafayette, CO (US)

( * ) Notice: Subject to any disclaimer, the term of this patent is extended or adjusted under 35 U.S.C. 154(b) by 98 days.

This patent is subject to a terminal disclaimer.

(21) Appl. No.: 18/920,500

(22) Filed: Oct. 18, 2024

(65) Prior Publication Data

US 2026/0113831 A1 Apr. 23, 2026

Related U.S. Application Data

(63) Continuation of application No. 17/781,298, filed as application No. PCT/US2020/063088 on Dec. 3, 2020, now Pat. No. 12,133,320.

(Continued)

(51) Int. Cl.

| | |
|---|---|
| ***H05H 1/00*** | (2006.01) |
| ***H01F 27/30*** | (2006.01) |
| ***H01F 38/14*** | (2006.01) |
| ***H01J 37/32*** | (2006.01) |
| ***H05H 1/46*** | (2006.01) |

(52) U.S. Cl.

CPC ........... *H05H 1/4652* (2021.05); *H01F 27/30* (2013.01); *H01F 38/14* (2013.01); *H01J 37/321* (2013.01)

(58) Field of Classification Search

None

See application file for complete search history.

(56) References Cited

U.S. PATENT DOCUMENTS

| | | | |
|---|---|---|---|
| 1,861,621 | A | 6/1932 | Buttolph |
| 2,521,513 | A | 9/1950 | Gray |

(Continued)

FOREIGN PATENT DOCUMENTS

| | | |
|---|---|---|
| EP | 0839929 | 5/1998 |
| JP | 2008126107 | 6/2008 |

(Continued)

OTHER PUBLICATIONS

Extended European Search Report for European Patent Appln. No. 20895046.9-1211, dated Nov. 15, 2023, 7 pages.

(Continued)

*Primary Examiner* — Kenneth B Wells

(74) *Attorney, Agent, or Firm* — Fish IP Law, LLP

(57) ABSTRACT

An induction feed through system for treating a flow of material is disclosed, including a high voltage energy source energizing a low-turn coil wrapped about an outer wall of a reaction chamber. The flow of electricity through the low-turn coil in turn energizes a high-turn coil wrapped about an inner wall disposed within the outer wall of the reaction chamber. An electrode assembly disposed within the reaction chamber is electrically coupled to and energized by the high-turn coil, in turn generating plasma in the reaction chamber. The plasma is used to excite a flow of material through the induction feed through system. The electromagnetic properties of the plasma further provide direct feedback to the low-turn and high-turn coils.

8 Claims, 8 Drawing Sheets

Related U.S. Application Data

(60) Provisional application No. 62/942,986, filed on Dec. 3, 2019.

(56) References Cited

U.S. PATENT DOCUMENTS

| | | | | |
|---|---|---|---|---|
| 2,524,754 | A | 10/1950 | Björklund | |
| 3,255,404 | A | 6/1966 | Kidwell | |
| 3,781,601 | A | 12/1973 | Imris | |
| 4,260,933 | A | 4/1981 | Volland | |
| 5,155,676 | A | 10/1992 | Spreen | |
| 5,234,529 | A * | 8/1993 | Johnson | H05H 1/46 204/298.34 |
| 5,416,391 | A | 5/1995 | Correa et al. | |
| 7,974,069 | B2 | 7/2011 | Mao et al. | |
| 8,130,893 | B2 | 3/2012 | Haramein | |
| 8,597,464 | B2 | 12/2013 | Choi | |
| 10,183,881 | B1 | 1/2019 | Fraser et al. | |
| 12,133,320 | B2 * | 10/2024 | Hill | H01J 37/321 |
| 2003/0071035 | A1 | 4/2003 | Brasilove | |
| 2003/0234616 | A1 * | 12/2003 | Dandl | H01J 37/32357 315/111.41 |
| 2004/0160190 | A1 | 8/2004 | Gonzalez et al. | |
| 2005/0254193 | A1 | 11/2005 | No et al. | |
| 2006/0113928 | A1 * | 6/2006 | Park | H01J 27/14 315/501 |
| 2006/0198485 | A1 | 9/2006 | Binderbauer | |
| 2009/0206974 | A1 | 8/2009 | Meinke | |
| 2012/0073756 | A1 | 3/2012 | Yamazawa | |
| 2012/0073757 | A1 | 3/2012 | Yamazawa | |
| 2014/0106573 | A1 * | 4/2014 | Terasaki | H01J 37/321 438/771 |
| 2014/0109886 | A1 | 4/2014 | Singleton et al. | |
| 2014/0209243 | A1 | 7/2014 | Kim et al. | |
| 2017/0330772 | A1 | 11/2017 | Yamazawa | |
| 2019/0089135 | A1 | 3/2019 | Gupta et al. | |
| 2022/0333531 | A1 | 10/2022 | Harris et al. | |
| 2023/0170185 | A1 | 6/2023 | Uhm et al. | |

FOREIGN PATENT DOCUMENTS

| | | |
|---|---|---|
| KR | 10-20090034903 | 4/2009 |
| WO | 2008156814 | 12/2008 |
| WO | 2017052789 | 3/2017 |

OTHER PUBLICATIONS

International Search Report and Written Opinion for corresponding PCT Application No. PCT/US2020/063088 dated Mar. 29, 2021, 14 pages.

* cited by examiner

INDUCTION FEED THROUGH SYSTEM

This application is a continuation of U.S. patent application Ser. No. 17/781,298 filed on May 31, 2022 and issued as U.S. Pat. No. 12,133,320, which claims priority to International Application no. PCT/US2020/063088 filed Dec. 3, 2020, which claims priority to U.S. provisional application No. 62/942,986 filed on Dec. 3, 2019. This and all other extrinsic references referenced herein are incorporated by reference in their entirety.

FIELD OF THE INVENTION

The field of the invention is electromagnetic feed through systems.

BACKGROUND

The background description includes information that may be useful in understanding the present invention. It is not an admission that any of the information provided herein is prior art or relevant to the presently claimed invention, or that any publication specifically or implicitly referenced is prior art.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

It is increasingly becoming more desirable to pre-process certain substances in order to improve the efficiency of certain processes. For example, in an internal combustion engine, it is common to pre-process a fuel and air mixture before it goes through the combustion process. This substance pre-processing is also conventionally applied to other emission control systems, compact particle accelerators, plasma railguns, terrestrial and off planet propulsion, antenna communication networks, material conditioning for generating nano-particles, etc.

One of the popular pre-process techniques involves the use of an electrode to excite the substance, possibly turning a portion of the substance into a plasma state to make it more efficient to process. Delivery of high voltage power to the electrode, which is usually located deep inside an excitation chamber where the pre-processing of the substance takes place, can be challenging. One of the issues is power leakage through the delivery channel.

Thus, there remains a need for a system and method that provide better power delivery to a plasma generating system.

SUMMARY OF THE INVENTION

The inventive subject matter provides apparatuses, systems, and methods to deliver high-voltage power to a plasma generating device via induction feed through. The main components of the inventive subject matter comprise a step-up transformer, high dielectric strength material(s), electrostatic or electromagnetic pick up(s), fluid flow form(s), and electrical load(s). A low turn primary coil is wrapped around an insulating material and connected to a high voltage power supply. A secondary high turn coil is either disposed in the medium being excited (solid, liquid, gas, plasma and/or mixture) and directly connected to the electrode assembly, or encapsulated in a closed container containing a high dielectric strength insulating substance (such as glass, quartz, transformer oil, insulated magnetic particles, ferroelectric particles, and/or tar) and connected to an electrode assembly by a short conductive feed through which protrudes into the medium being excited from the insulating container. The plasma created by the electrode assembly (non-thermal or thermal) is surrounded by the primary and secondary coils in such a way that the electromagnetic fields and electrostatic fields generated from the plasma induce a broad spectrum of frequencies onto the primary and secondary coils, which in turn forms a direct feedback to the plasma electrode assembly regardless of electrical filtering and/or extra circuitry.

In some embodiments, such an induction feed through system can be applied in many ways. For example, it can be applied in treating complex materials (e.g., fuel streams, air streams, exhaust streams, combined streams, etc, in liquid, solid, gas, or plasma phase, or combination thereof) using low complexity equipment. Certain fast chemical processes require a complicated feedback process. Favorably, the induction feed through system of the inventive subject matter changes its influencing fields quicker using direct feedback than is attained with complicated feedback processes known in the art. The inventive subject matter can also be applied to energy transmission systems to quench corona loss or voltage breakdown of a transformer, transmission line, or feed through. Viewed from another perspective, the transformer, transmission line, and feed through are integrated into a single device by the inventive subject matter, providing reduced complexity, increased power efficiency, and improved feedback response.

The inventive subject matter can also be applied to energy production. The direct feedback feature of the induction feed through system self-regulates kinetic and potential energy of the plasma, optimizing the power factor between the power supply, device, and load. Coefficient of performance is increased through coupling closed electric, magnetic, and photonic fields with the near and far field open electric, magnetic, and photonic fields.

The inventive subject matter can also be applied to propulsion, for example spacecraft propulsion. The induction feed through system enables increased hydrodynamic control of a medium through direct electro-hydro-dynamic (EHD) and magneto-hydro-dynamic (MHD) feedback. Micro pressure differentials between particle-particle interactions are cohered into larger ion acoustic displacements, generating compressed and rarified waves in the plasma which are used to accelerate the high energy and neutral particles influenced by the induction feed through system.

In some embodiments, an electrode assembly is disposed within the inner chamber of a reaction chamber. The electrode assembly is connected to a low-turn coil, and a first electrode on a high-turn coil is further connected to ground. A second electrode on the high-turn coil is isolated from ground. In some embodiments, the first electrode and the second electrode are not the same. The assembly can include a third electrode connected to the low-turn coil, typically located upstream of the first or second electrode. In preferred embodiments, the low-turn coil is disposed about an outer wall of the reaction chamber, and the high-turn coil is disposed about an outer wall of the inner chamber. In some embodiments, the high-turn coil is disposed about an interior wall of the inner chamber.

Various objects, features, aspects and advantages of the inventive subject matter will become more apparent from the following detailed description of preferred embodiments, along with the accompanying drawing figures in which like numerals represent like components.

DETAILED DESCRIPTION

The following description includes information that may be useful in understanding the present invention. It is not an admission that any of the information provided herein is prior art or relevant to the presently claimed invention, or that any publication specifically or implicitly referenced is prior art.

Figure 1A:
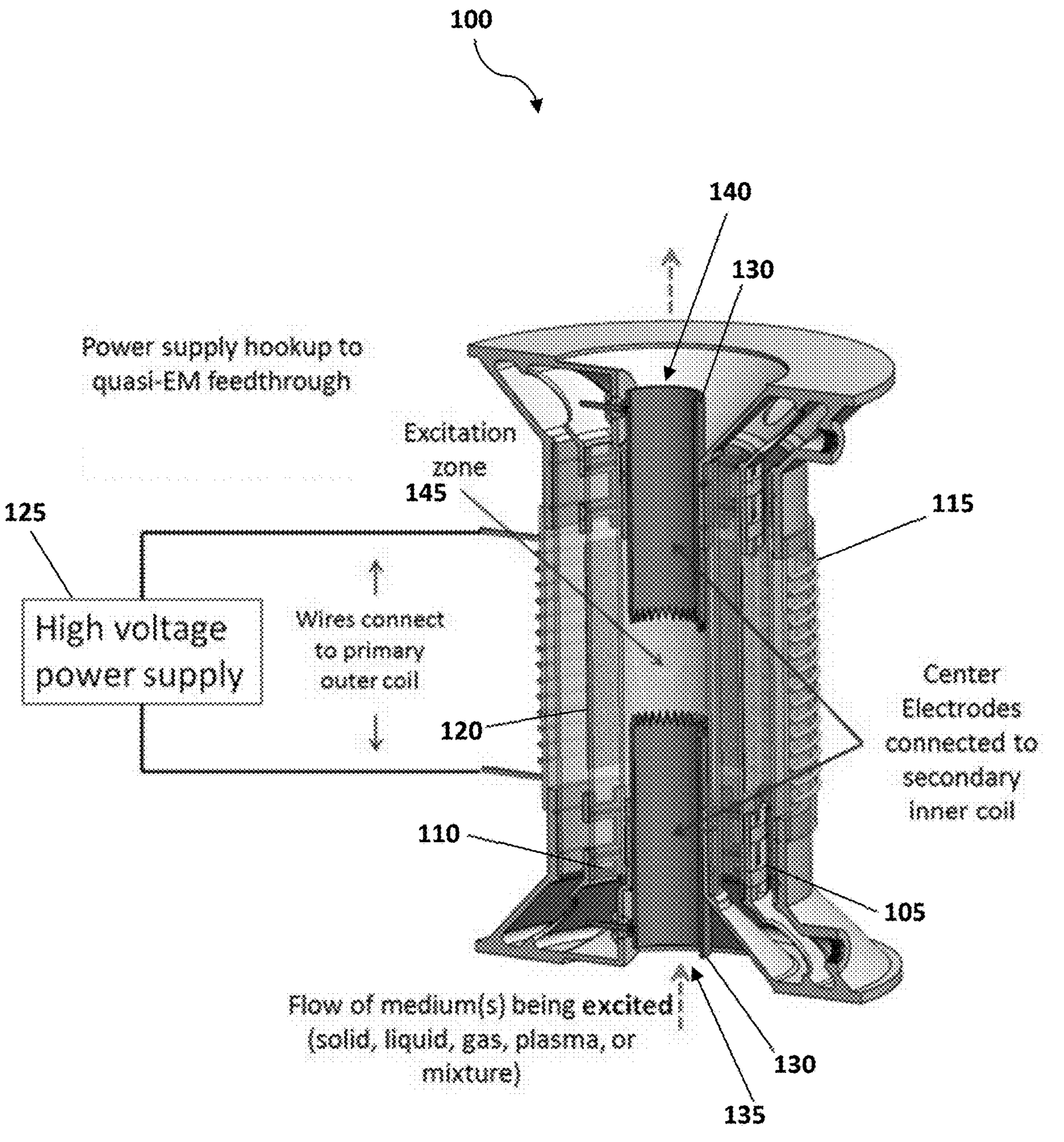
FIG. 1A illustrates an exemplary induction feed through system of some embodiments.

FIG. 1A illustrates an example of an induction feed through system 100. The induction feed through system 100 includes an outer chamber 105 and an inner chamber 110. As shown, the inner chamber 110 is at least partially disposed within the outer chamber 105. Preferably, the entire inner chamber 110 is disposed within the outer chamber 105. In some embodiments, the outer chamber 105 is made of mostly of insulating materials such as glass, quartz, etc. In some embodiments, the inner chamber 110 is also made of mostly insulating materials such as glass, quartz, etc.

The induction feed through system 100 also includes a primary coil 115 and a secondary coil 120. Each of the primary coil 115 and secondary coil 120 comprises a majority of highly electric conductive materials. Examples of coils that can be used as the primary coil 115 and the secondary coil 120 include copper wire, lithographically deposited conductor, a tube with conductive medium, etc. In some embodiments, the primary coil 115 is wrapped around the exterior wall of the outer chamber 105. The primary coil 115 is also connected to a high-voltage power supply 125. In some embodiments, the secondary coil 120 is wrapped around the exterior wall of the inner chamber 110. As shown, the secondary coil 120 has a higher turn count than the primary coil 115, such that when placed near each other, the primary coil 115 and secondary coil 120 work together to form a step-up transformer.

Preferably the secondary coil 120 has a substantially higher turn count (e.g., twice, three times, four times as many, etc.) than the primary coil 115. The primary coil 115 and the secondary coil 120 are not physically connected with each other. In some embodiments, the secondary coil 120 is encapsulated in a closed container containing a high dielectric strength insulating substance (such as glass, quartz, transformer oil, insulated magnetic particles, ferroelectric particles, and/or tar), where the closed container is disposed around the exterior wall of the inner chamber 110.

Preferably, the power supply 125 provides a voltage within a range of 500 Volts (V) to 50,000V to the primary coil 115. Through the step-up transforming aspect of the primary coil 115 and secondary coil 120, the secondary coil 120 will be induced to carry a higher voltage within a range of 500V to 1 mega-Volts. With this power input and output, the coil configuration can generate a magnetic field having a strength between 1,000 gauss and 100,000 gauss. One of the advantages is that this system can provide a very high voltage to the electrode without transmitting such a high voltage through the power line to avoid power leakage.

In some embodiments, the induction feed through system 100 also includes an electrode assembly 130. The electrode assembly 130 is preferably disposed within the inner chamber 110. The electrode assembly 130 is connected with the secondary coil 120 such that the secondary coil 120 can be used to power the electrode assembly 130. In some of these embodiments, the induction feed through system 100 includes a short conductive feedthrough that passes through the closed encapsulation to connect the secondary coil 120 directly to the electrode assembly 130. The electrode assembly 130 includes at least one electrode configured to emit electromagnetic energy within the inner chamber 110.

The inner chamber 110 also includes an inlet 135 and an outlet 140, such that substances to be excited by the electromagnetic energy produced by the electrode assembly 130 can pass through the excitation zone 145 of the inner chamber 110. Substances that can pass through the excitation zone 145 can include solid, liquid, gas, plasma, or a mixture of any of these substances (e.g., air, water/water vapor, industrial fluids, and internal combustion engine exhaust gases). In some embodiments, excitation zone 145 is empty (except for the substance to be excited), but the excitation zone can further include fill material for retaining, channeling, filtering, or directing the substance or portions thereof (e.g., porous substrate, permeable layer, semi-permeable layer, selectively permeable layer, rotor, capillaries, cavities, etc).

The substance may pass through the inner chamber 110 of the induction feed through system 100 according to the direction indicated by the arrows. The housing of the outer chamber 105 and the inner chamber 110 insulate the primary coil 115 from the secondary coil 120, and also insulate both coils from the excitation zone 145. Under this configuration, the induction feed through system 100 discharges plasma (either thermal or non-thermal) within the excitation zone 145 to excite substances that pass through excitation zone 145. The electromagnetic and electrostatic fields generated from the plasma and the excited substance may induce a broad spectrum of frequencies (oscillations) back onto the primary coil 115 and secondary coil 120 as feedback.

The feedback on the primary coil 115 and secondary coil 120 can be detected as electrical drive waveforms, which can be used to (1) ascertain the type of substance being excited inside the excitation zone 145, (2) ascertain the energy density of the plasma generated by the electrode assembly 130, (3) increase the coefficient of plasma generation performance, (4) increase the chemical selectivity of the plasma process, and (5) modulate the power in sending and receiving information via plasma antenna. The inventive subject matter allows this detection without the use of any additional circuitry or complex feedback system.

In some embodiments, the induction feed through system 100 can also include a magneto-hydrodynamic cell (not shown) configured to harvest energy from the movement of charged particles flowing within the excitation zone 145. In some embodiments, the magneto-hydrodynamic cell is disposed inside the excitation zone 145 or downstream of the excitation zone 145. The magneto-hydrodynamic cell of some embodiments can be made up of two electrodes, which are disposed in the charged medium. The electrodes can be the powered electrode assembly as well as another electrode assembly disposed in the same excitation zone 145. The charged particles moving through the excitation zone 145 may induce a voltage onto the secondary coil 120 and the primary coil 115. The magneto-hydrodynamic cell of some embodiments has complementary magnetic, electric, acoustic, thermionic, and/or photonic members which convert the movement of charged particles in the plasma directly into electrical power, as well as focus the electromagnetic, electrostatic, acoustic, thermionic, and photonic emissions of the plasma in such a way as to establish and/or regulate instabilities in the plasma.

In some instances, electromagnetic radiation that is emitted from the excited substance in the excitation zone 145 is redirected back onto the excited substance and or absorbed by the assembly. The electrode assembly 130, the insulating materials used in the outer chamber 110, and the electromagnetic coils 115 and 120 will inherently reflect some portion of the electromagnetic spectrum radiated from the plasma back onto the plasma. This electromagnetic radiation emanated and reflected back onto the plasma assists in the ionization of the medium by lowering the work function of the electrodes though ultraviolet light reflecting onto the electrode assembly, and the photons reflected back onto the plasma informs the plasma about other photo-ionization processes occurring in selective regions of the plasma as well as un-ionized gases pre and post plasma.

In some embodiments, the induction feed through system 100 also includes capacitive/electrostatic inductive coupling. Conductive plates housed inside and outside the insulating housing of the outer chamber 105 and inner chamber 110 deliver high voltage DC to the electrodes and also provides a direct capacitive feedback on the plasma. In some embodiments, the induction feed through system 100 includes two inner conductive plates, where each is connected to an electrode terminal.

In some embodiments, the induction feed through system 100 also includes inductive coupling. The inductive coupling can be implemented as feedback electromagnetic coils disposed near to or within the ionized medium (within the excitation zone 145) for measuring, influencing, or directly providing feedback to the secondary coil 120 and/or the primary coil 115.

In some embodiments, the induction feed through system 100 also includes negative resistance coupling. A dielectric container that contains an ionizable medium (e.g., gas, liquid, solid, plasma, or mixture thereof), which can be used to measure, influence, or provide direct feedback to the secondary coil 120 and/or the primary coil 115.

In some embodiments, the induction feed through system 100 also includes a magneto-hydrodynamic/electro-hydrodynamic coupling. Electrodes disposed in the plasma stream are surrounded by magnetic fields generated from the primary coil 115 and the secondary coil 120, DC permanent magnetic or other external magnetic fields sources. The magneto-hydrodynamic/electro-hydrodynamic coupling can be used as a feedback mechanism for the primary coil 115 and/or the secondary coil 120, or used to generate electrical power directly from the charge separation of the movement of charged particles.

In some embodiments, the inductive feed through system 100 also provides photonic feedback by having the electrode assembly, insulating chamber, and the electromagnetic coils reflect some portion of the radiated electromagnetic spectrum emitted from the plasma back onto the plasma. The inductive feed through system 100 can also include semi-conductive sensors, which can measure the chemical optical emissions from the plasma for determining chemical reactions, electrical feedback, and heat signatures.

Figure 1B:
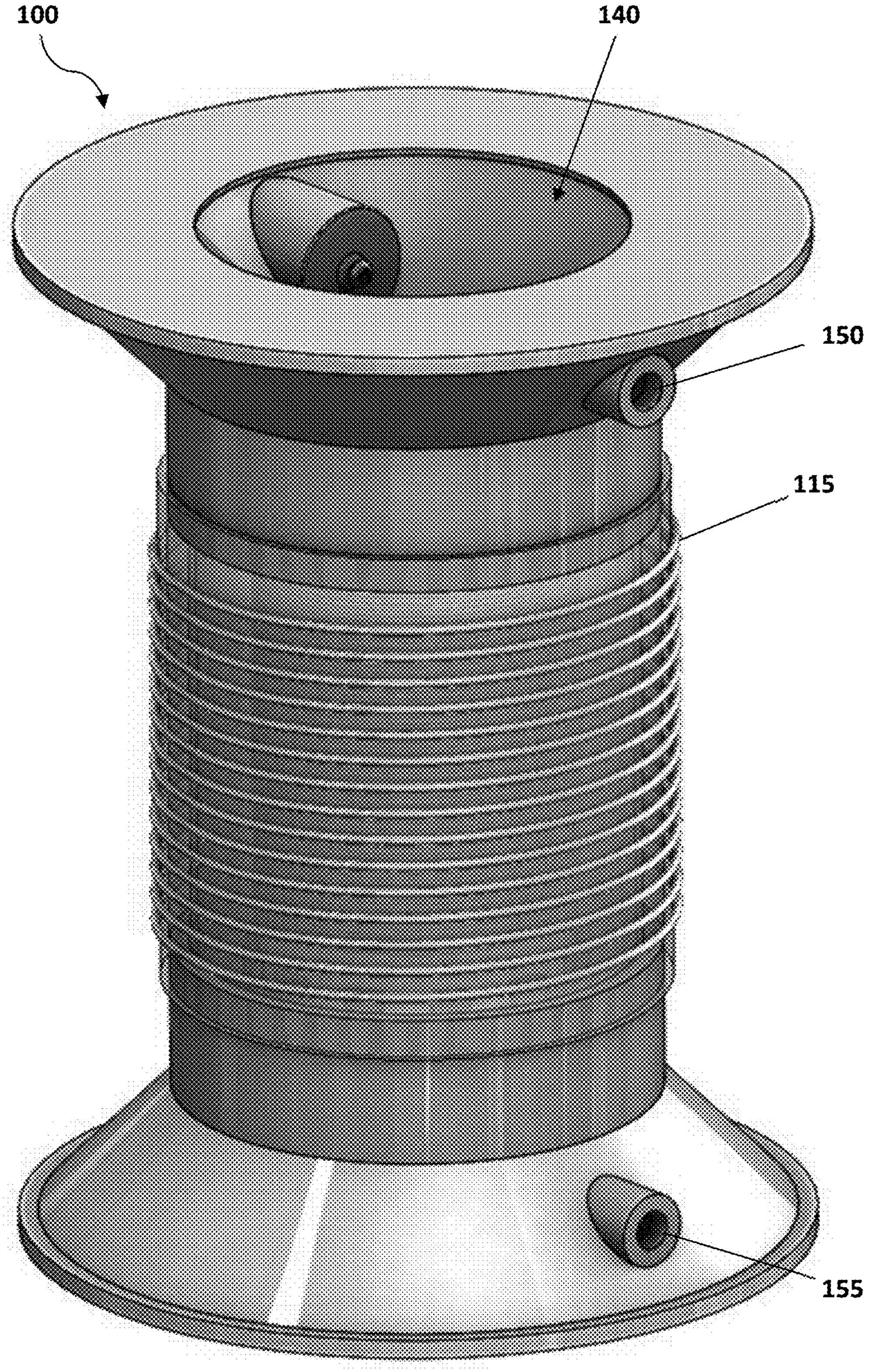
FIG. 1B illustrates a top, perspective view of the induction feed through system of some embodiments.

FIG. 1B illustrates a top, perspective view of the induction feed through system 100. Primary coil 115 is clearly visible wrapped around the external wall of the outer chamber. Dielectric medium ports 150 and 155 are also more clearly visualized. While various dielectric mediums (and phases) are fit for use in the inventive subject matter, in preferred embodiments the dielectric medium is a liquid dielectric. Dielectric medium ports 150 and 155 permit the dielectric medium to fill outer chamber 105 with liquid dielectric.

Figure 1C:
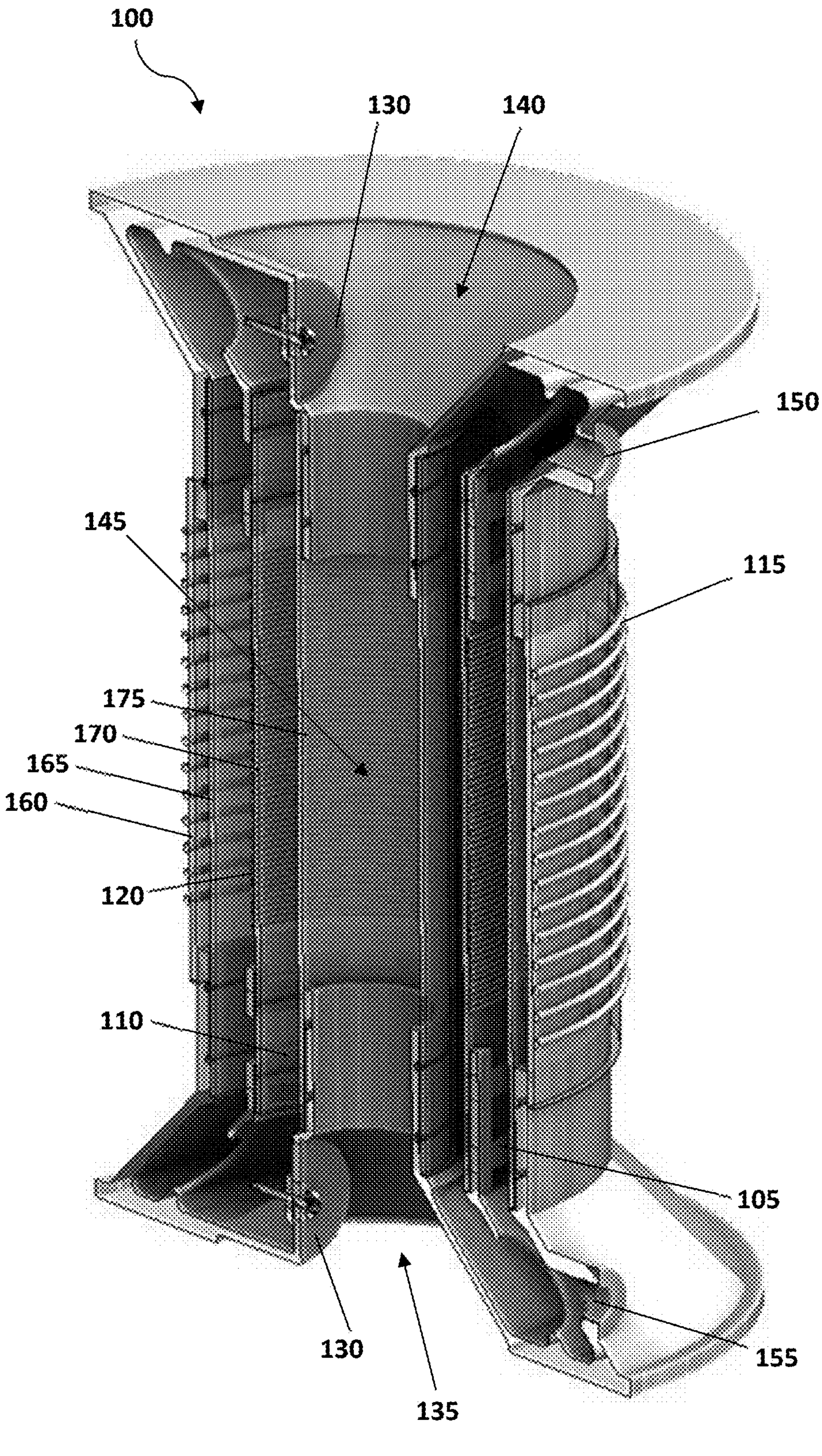
FIG. 1C illustrates another top, perspective, cutaway view of the induction feed through system of some embodiments.

FIG. 1C illustrates another top, perspective, cutaway view of the induction feed through system 100. In this view, insulating layers 160, 165, 170, and 175 are more clearly depicted. In this embodiment, primary coil 115 wraps around insulating layer 160, while insulating layer 165 makes up part of the wall that defines outer chamber 105. Insulating layer 170 makes up another wall of outer chamber 105, around which secondary coil 120 is wrapped. Insulating layer 175 makes up part of the wall that defines excitation zone 145.

Figure 1D:
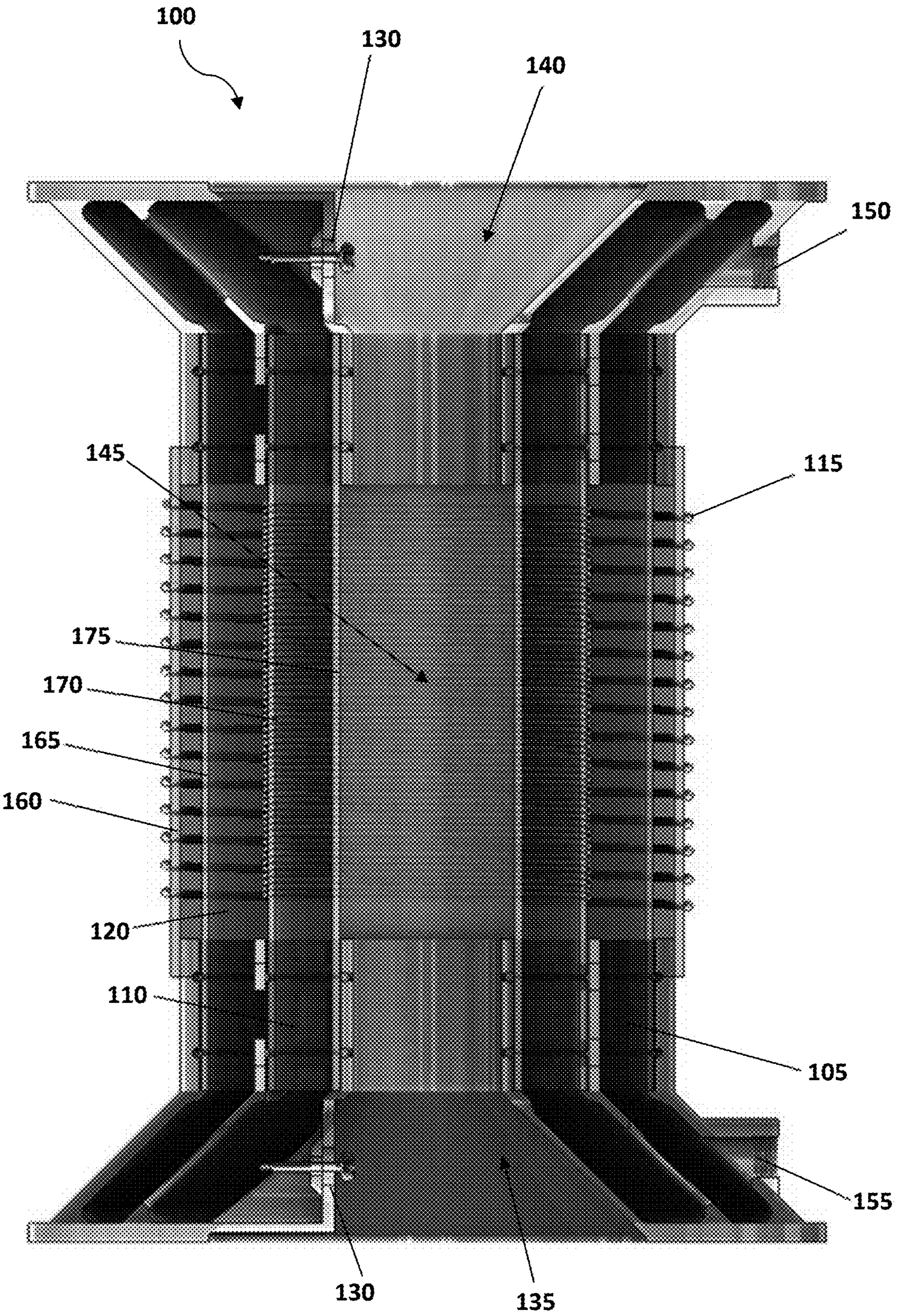
FIG. 1D illustrates a side, cutaway view of the induction feed through system of some embodiments.

FIG. 1D illustrates a side, cutaway view of the induction feed through system 100.

FIGS. 1A-1D illustrate one embodiment of the inventive subject matter in which the secondary coil wraps around the exterior wall of the inner chamber of the induction feed through system. In some embodiments however, the secondary coil can be disposed within the inner chamber such that when a substance passes through the excitation zone, the substance is surrounding the secondary coil.

Figure 2A:
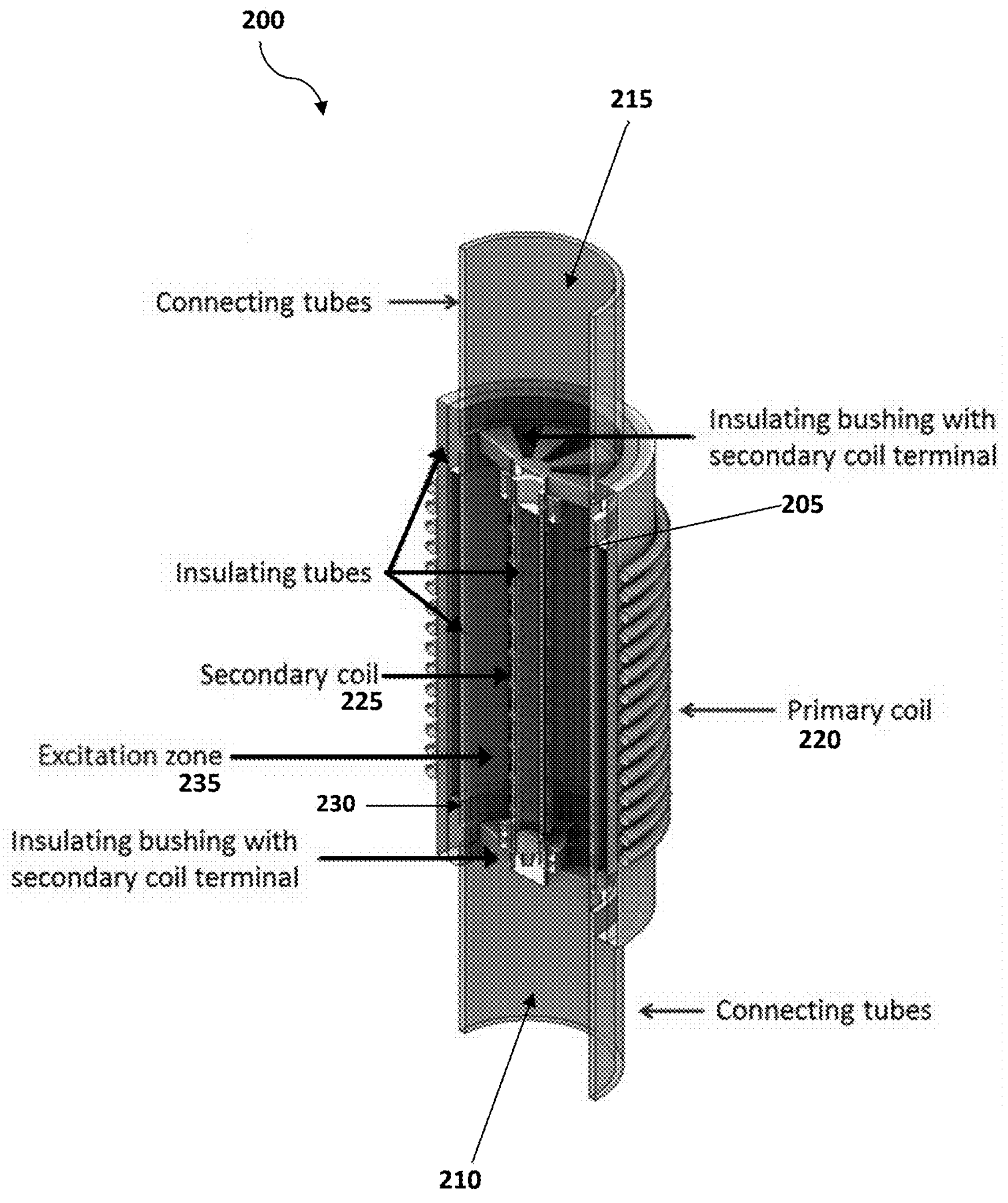
FIG. 2A illustrates an alternative induction feed through system of some embodiments.

FIG. 2A illustrates an example of such an induction feed through system 200. The induction feed through system 200 includes a chamber 205 having an inlet 210 configured to allow a substance to enter into the chamber 205 and an outlet 215 configured to allow the substance to exit the chamber 205. The induction feed through system 200 also includes a primary coil 220 and a secondary coil 225. The primary coil 220 is disposed on an exterior wall of the chamber 205 while the secondary coil 225 is disposed within the chamber 205.

Similar to the induction feed through system 100, the secondary coil 225 preferably has a substantially higher turn count (e.g., twice, three times, four times as many, etc.) than the primary coil 220. The primary coil 220 and the secondary coil 225 are not physically connected with each other. In some embodiments, the secondary coil 225 is encapsulated in a closed container containing a high dielectric strength insulating substance (such as glass, quartz, transformer oil, insulated magnetic particles, ferroelectric particles, and/or tar), where the closed container is disposed within the chamber 205.

In some embodiments, the induction feed through system 200 optionally includes an electrode assembly. The electrode assembly includes at least one electrode configured to emit electromagnetic energy within an excitation zone 235 of the chamber 205. The electrode assembly is preferably disposed within the chamber 205. Unlike the induction feed through system 100, the secondary coil 225 of the induction feed through system 200 is disposed within the electrode assembly 230 and is optionally directly connected with the electrode assembly.

Figure 2B:
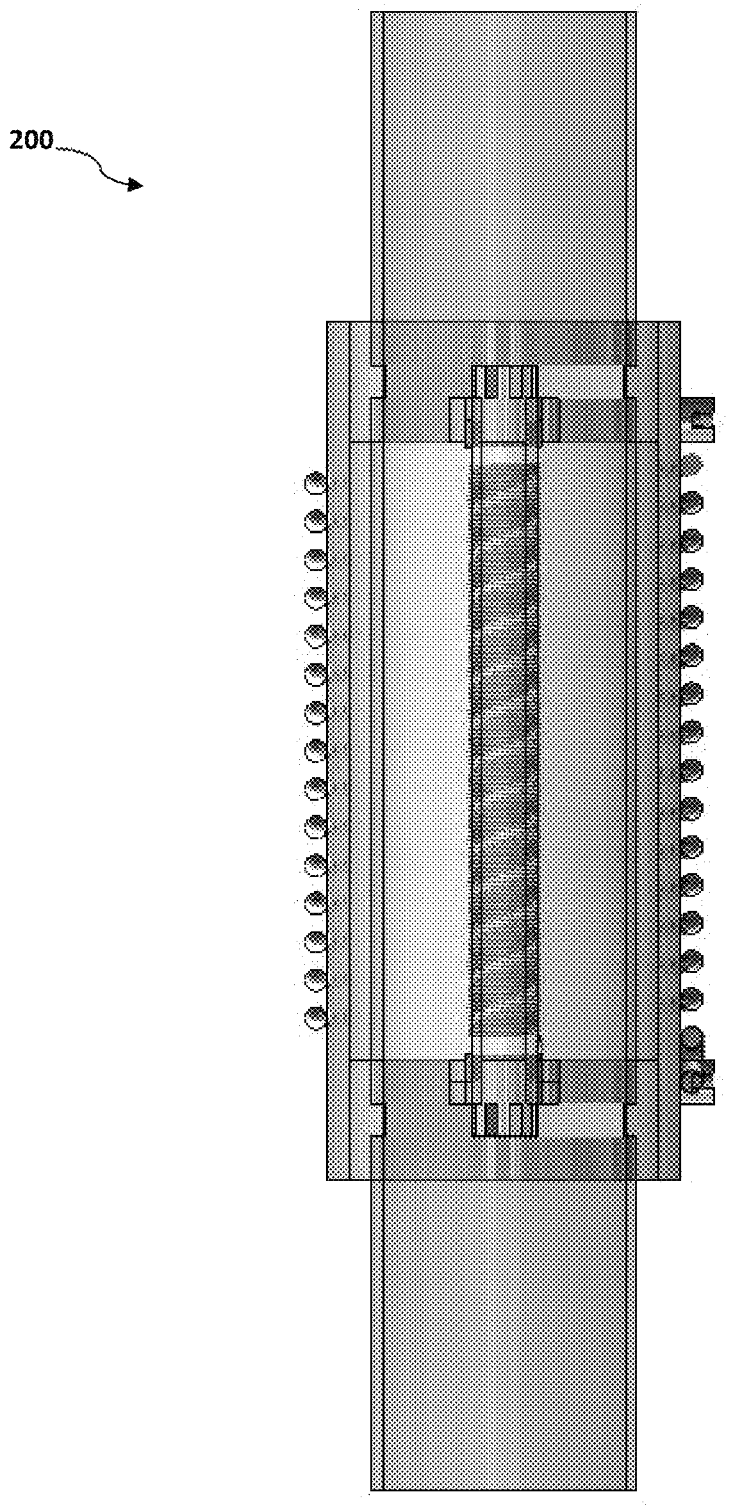
FIG. 2B illustrates a side cutaway view of the alternative induction feed through system of some embodiments.

FIG. 2B illustrates a side cutaway view of the induction feed through system 200.

Figure 2C:
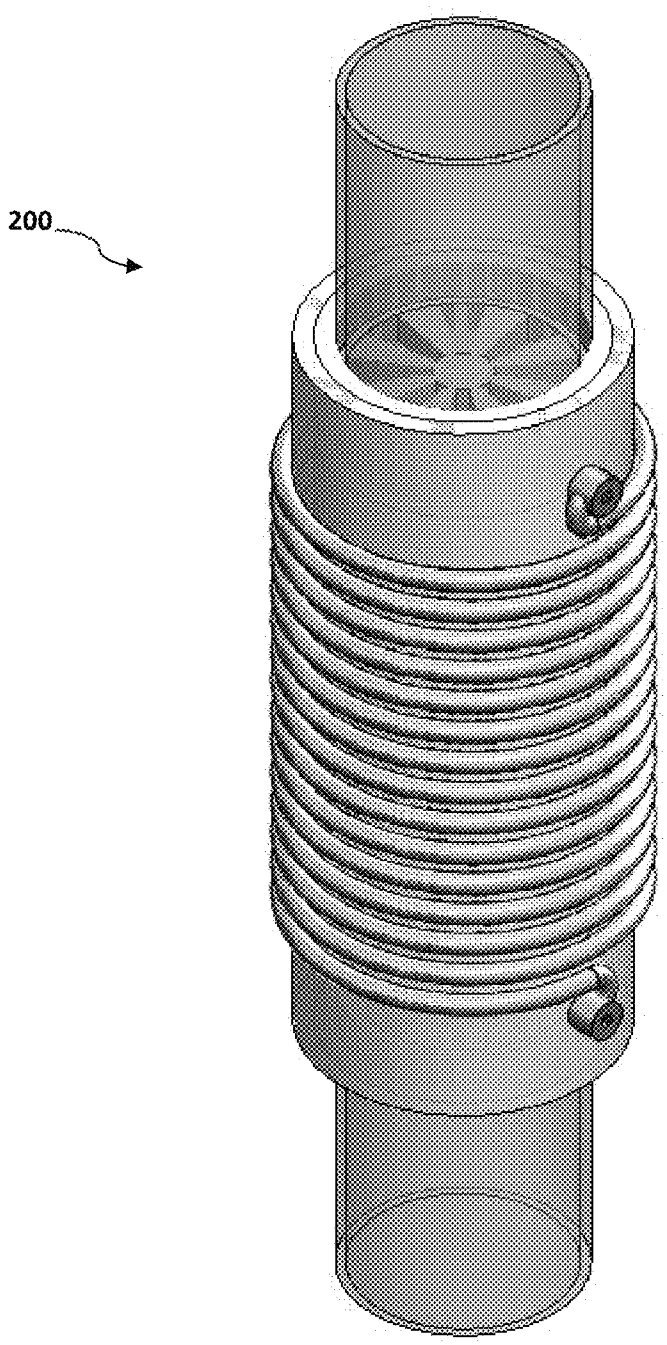
FIG. 2C illustrates a top, perspective view of the alternative induction feed through system of some embodiments.

FIG. 2C illustrates a top, perspective view of the induction feed through system 200.

Figure 3A:
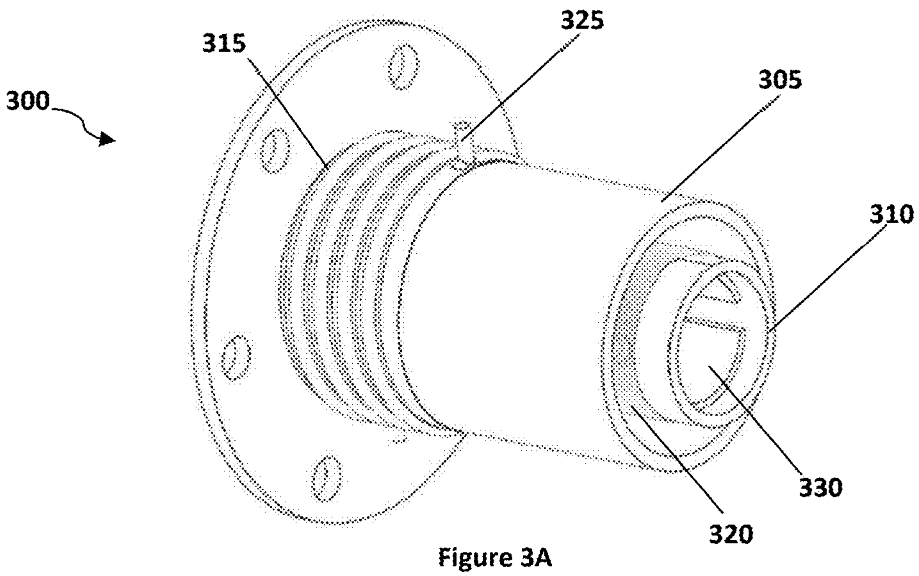
FIG. 3A illustrates another induction feed through system.

FIG. 3A depicts a side profile view of a spacecraft thruster 300. Spacecraft thruster 300 uses induction feed through systems of the inventive subject matter to propel spacecraft. Thruster 300 includes outer wall 305 and inner wall 310, each preferably an insulator. Primary coil 315 is coiled about a portion of outer wall 305, and secondary coil 320 is coiled about a portion of inner wall 310. Primary coil 315 is a low-turn coil and secondary coil 320 is a high-turn coil as previously described. High voltage connector 325 is used to energize primary coil 315 with a high voltage source. Electrode assembly 330 is disposed on an inner surface of inner wall 310.

Figure 3B:
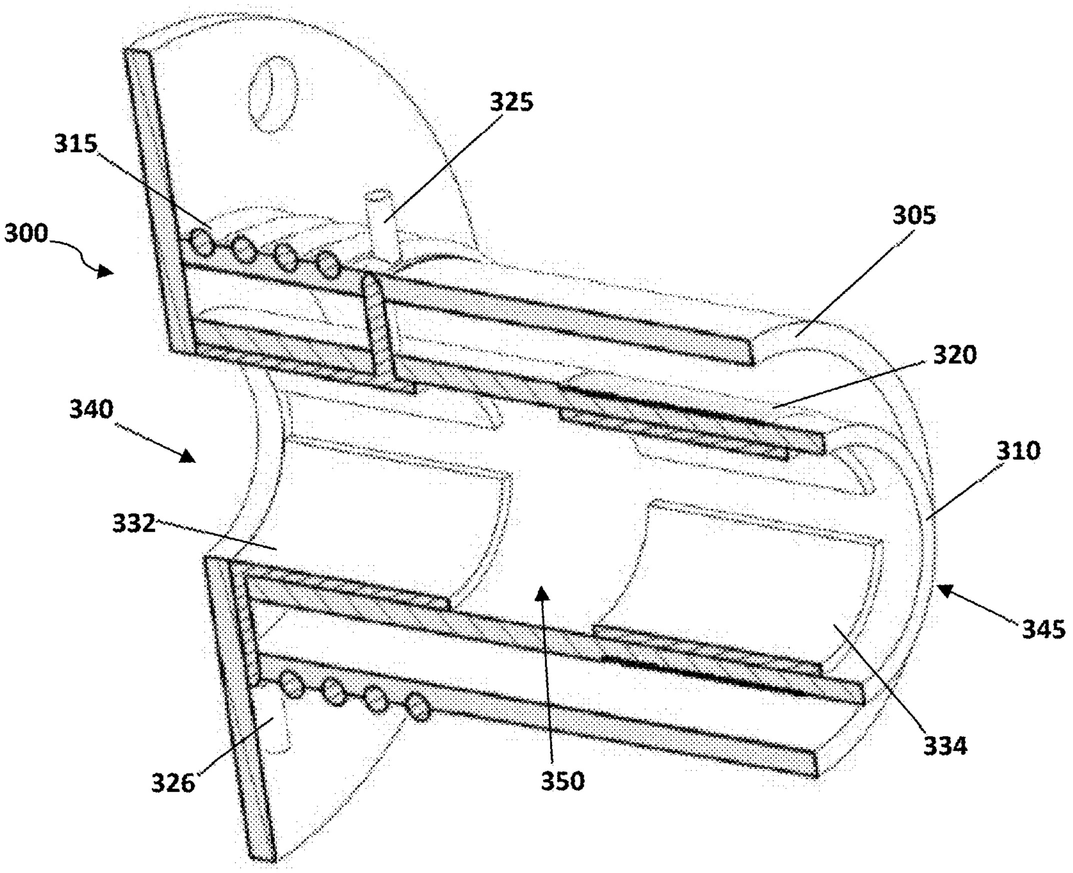
FIG. 3B illustrates a side cutaway view of the feed through system of FIG. 3A.

FIG. 3B depicts a side cutaway view of thruster 300. In this perspective, high voltage connector 325, which energizes primary coil 315, can also be seen. Electrode assembly 330 includes low-turn coil electrodes 332 connected to primary coil 315, and high-turn coil electrodes 334 connected to secondary coil 320. In some embodiments, one of electrodes 334 is grounded. Reaction zone 350 is also depicted within inner wall 310. Inlet 340 and outlet 345 allow propellant (e.g., a gas, a fluid, a mass, etc.) to pass through reaction zone 350 and generate thrust.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

Unless the context dictates the contrary, all ranges set forth herein should be interpreted as being inclusive of their endpoints, and open-ended ranges should be interpreted to include commercially practical values. Similarly, all lists of values should be considered as inclusive of intermediate values unless the context indicates the contrary.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

It should be noted that any language directed to a computer should be read to include any suitable combination of computing devices, including servers, interfaces, systems, databases, agents, peers, engines, controllers, or other types of computing devices operating individually or collectively. One should appreciate the computing devices comprise a processor configured to execute software instructions stored on a tangible, non-transitory computer readable storage medium (e.g., hard drive, solid state drive, RAM, flash, ROM, etc.). The software instructions preferably configure the computing device to provide the roles, responsibilities, or other functionality as discussed below with respect to the disclosed apparatus. In especially preferred embodiments, the various servers, systems, databases, or interfaces exchange data using standardized protocols or algorithms, possibly based on HTTP, HTTPS, AES, public-private key exchanges, web service APIs, known financial transaction protocols, or other electronic information exchanging methods. Data exchanges preferably are conducted over a packet-switched network, the Internet, LAN, WAN, VPN, or other type of packet switched network.

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

It should be apparent to those skilled in the art that many more modifications besides those already described are possible without departing from the inventive concepts herein. The inventive subject matter, therefore, is not to be restricted except in the scope of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. An electrode assembly comprising:

a first electrode disposed within a reaction zone a first coil disposed about the reaction zone;

wherein the first electrode is connected to ground and extends coaxially with the first coil; and a second coil inductively coupled to the first coil and isolated from ground.

2. The electrode assembly of claim 1, further comprising a second electrode disposed within the reaction zone and connected to the second coil.

3. The electrode assembly of claim 1, wherein the first coil has a low-turn count relative to the second coil.

4. The electrode assembly of claim 1, wherein the first coil overlaps the second coil.

5. The electrode assembly of claim 1, wherein the second coil is partially nested within the first coil.

6. The electrode assembly of claim 1, wherein the first coil extends coaxially with the second coil, and the second coil is disposed within the reaction zone.

7. The electrode assembly of claim 1, further comprising an inner chamber disposed within the reaction zone, wherein the second coil is disposed between the inner chamber and the first coil.

8. The electrode assembly of claim 2, wherein the first and second electrodes are configured to generate a plasma in the reaction zone.

* * * * *